United States Patent [19]

Mader

[11] 3,761,833

[45] Sept. 25, 1973

[54] AMPLITUDE STABILIZED L.C. OSCILLATOR WITH OUTPUT CIRCUITS FOR PRODUCING SEMI-SINUSOIDAL CLOCK PULSES

[75] Inventor: Heinz Bernhard Mader, Weinfelden, Switzerland

[73] Assignee: International Standard Electric Corporation, New York, N.Y.

[22] Filed: Aug. 14, 1972

[21] Appl. No.: 280,601

[30] Foreign Application Priority Data

Sept. 2, 1971 Great Britain.................40941/71

[52] U.S. Cl........................ 331/45, 331/60, 331/75, 331/109, 331/117 R, 331/183

[51] Int. Cl........................... H03b 3/02, H03b 5/12

[58] Field of Search.................... 331/45, 60, 74–76, 331/109, 117 R, 183

[56] References Cited

UNITED STATES PATENTS

| | | | |
|---|---|---|---|
| 3,531,737 | 9/1970 | Thakore | 331/109 |
| 3,668,436 | 6/1972 | Bacon | 331/60 X |

*Primary Examiner*—Roy Lake
*Assistant Examiner*—Siegfried H. Grimm
*Attorney*—C. Cornell Remsen, Jr. et al.

[57] ABSTRACT

This self-oscillating clock driver circuit generates two half-sinusoidal, non-overlapping phases of output intended primarily for driving two-phase MOST circuits in a quick-step push-button dial telephone. A Hartley oscillator, modified to include an amplitude stabilization circuit, drives a pair of transistor output circuits which in turn drive the capacitive loads in a push-pull manner. The clock driver arrangement also functions as a master oscillator in the subscriber handset to provide the push-button tone frequencies.

6 Claims, 7 Drawing Figures

AMPLITUDE STABILIZED L.C. OSCILLATOR WITH OUTPUT CIRCUITS FOR PRODUCING SEMI-SINUSOIDAL CLOCK PULSES

BACKGROUND AND SUMMARY OF THE INVENTION

This invention relates to frequency generators, with particular reference to clock driver circuit arrangements producing regularly-spaced pulses.

According to the invention, there is provided a clock-pulse generator arranged to produce a series of semi-sinusoidal clock pulses of the same polarity and of specified repetition frequency in a capacitive load, each said pulse being separated from the adjacent pulse by a predetermined interval of time, which comprises an amplitude-stabilized self-oscillating sine-wave oscillator consisting of a resonating coil-and-capacitor circuit arranged to drive a pair of output circuits connected to said circuit and to output terminals of said oscillator in push-pull manner, each said output circuit being biased by unidirectional potential derived from said oscillator and being arranged to suppress one-half of each sine wave thereby to supply a series of spaced, interlocking, unidirectional semi-sinusoids into an external capacitive load coupled to said output circuits.

BRIEF DESCRIPTION OF THE DRAWINGS

The invention will be more particularly described with reference to the accompanying drawings illustrating a self-oscillating clock driver circuit, in which:

FIG. 1 is a block diagram of the clock driver, while FIG. 1A shows the wave-forms derived in the respective output stages;

FIG. 2 is a circuit schematic of the basic oscillator with its stabilization-circuit;

FIG. 3 is a circuit schematic of one of the output stages, while FIG. 3A is a wave-form diagram used in the explanations;

FIG. 3B shows an alternative arrangement to FIG. 3;

FIG. 4 shows schematically the generation of the pulse separation bias from the oscillator voltage swing, while FIG. 4A shows the composite output waveform produced.

DESCRIPTION OF THE PREFERRED EMBODIMENTS

The self-oscillating clock driver circuit to be described generates two half-sinusoidal non-overlapping phases of output intended primarily for driving two-phase MOST circuits within a push-button telephone subscriber's equipment. This special application mainly determines the required characteristics of the clock driver. These are as follows:

a. operating temperature range — −40 to +55 degrees C;
b. power consumption — less than 25 mW;
c. battery supply voltage range — 5.5 to 7 volts;
d. frequency — 20 KHz ± 5 percent (frequency tolerance)
e. amplitude stability ± 12 percent
f. low cost.

With regard to characteristic (b), low power dissipation of the driver is required, since the circuit is intended to be fed from a rechargeable battery and the only source of charging current available in such a case is the microphone feed current over the subscriber's line: though operation in such manner is by no means mandatory; and with regard to characteristic (d), the clock driver must function also as a master oscillator in the subscriber hand-set to provide so-called "dial" pulse frequency, that is, the necessary tone or tones for generating the selection frequencies in response to the push-button digit selected. This is a system requirement.

The frequency of 20 KHz quoted is that of the basic oscillator as a sinusoidal generator; the pulse repetition frequency of the clock driver output will be double this, since a clock pulse is derived every half-cycle of the oscillator output.

Figures 1, 1A, 2, 3, 3A, 3B, 4, 4A:
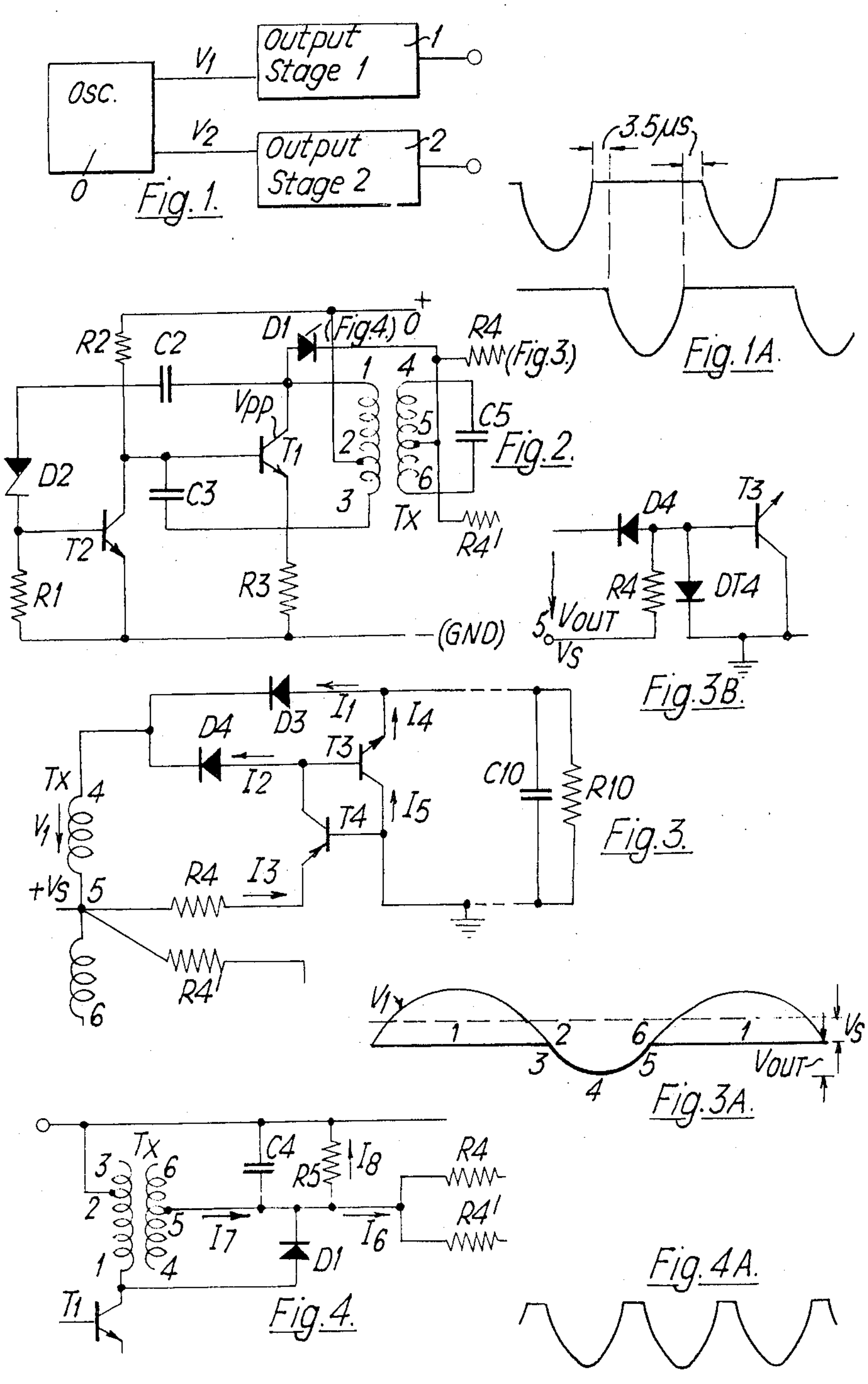

A block diagram of the clock driver is given in FIG. 1, and consists of an oscillator 0 feeding two active output stages 1 and 2. Oscillator 0 is an L-C oscillator generating two output voltages $V_1$ and $V_2$, mutually at 180°. The output stages each convert the sinusoidal waveforms of $V_1$ and $V_2$ into half-sinusoidal clock-waveforms having a clock-pulse separation amounting to some 3.5 $\mu$sec, as shown in FIG. 1A, alongside.

A suitable form of oscillator for the frequency in question (20 KHz) is the well-known Hartley oscillator, modified by means of an amplitude stabilization circuit, as illustrated in FIG. 2. In this figure, transistor $T_1$ is the oscillator element, whose collector feeds the primary winding 1-2 of a resonant transformer Tx, tuned on its secondary winding 4-6 by a capacitor C5. The primary winding 1-2 is the major portion of a winding 1-3 of which the portion 2-3 forms a tertiary winding connected to the primary winding at 2. Point 2 is also connected to the positive supply rail 0. The tertiary winding acts as a feedback winding for the oscillator, energy being fed back via capacitor C3 to the base of the transistor $T_1$. On grounds of economy and size, the transformer is provided both as oscillator transformer and coupling transformer to the two output stages, and consists of a single pot core. The resistor R3 connected from the emitter of $T_1$ to ground provides stable working conditions for the oscillator and gives the oscillator a good amplitude control characteristic by varying the base voltage of $T_1$ in the following manner.

The collector of transistor $T_1$ is coupled by capacitor $C_2$ and zener diode $D_2$ to the base of a second transistor $T_2$, biased from the negative rail via a resistor $R_1$. This circuit performs a comparison between the oscillator swing at the collector of $T_1$ (voltage $V_{pp}$) and the zener voltage of diode $D_2$. When the swing increases in amplitude, the zener diode conducts during the peak amplitude of the swing, causing positive and negative current spikes to be injected alternately into $R_1$. If the oscillator amplitude increases further, current is injected into the base of $T_2$, causing the collector potential of $T_2$ to fall, and hence also the potential at the base of $T_1$. This effectively reduces the oscillator amplitude. In this way, amplitude stabilization is achieved.

Capacitor $C_3$, in addition to providing feedback, also forms, together with $R_2$ (the feed resistor from the zero rail to the base of $T_1$ and collector of $T_2$), a low pass filter ensuring loop stability.

Driving a zener diode in a pulsed mode, as described, allows the use of a conventional and cheap zener diode having acceptably low power dissipation.

The output stages of the driver each consist principally of the circuit shown in FIG. 3, comprising a resistor-diode-transistor network: $R_4$-$D_3$-$D_4$-$T_3$-$T_4$, unprimed in the upper stage shown, and primed in the lower stage (not shown beyond $R_4'$), connected respectively across the halves 5-4, 5-6, of the tuned secondary winding of the oscillator transformer $T_x$. These stages feed the output load, represented as C10-R10, in parallel, but in push-pull manner, that is, alternately, the full arrangement being shown in the complete circuit of FIG. 5.

A steady bias potential $+V_S$ is applied to the center-tap 5 to provide the required separation of the half-sinusoids applied to the load from the respective output stages, and, in a typical case, $V_S$ amounts to 3.7v for a peak output voltage of 25v across the load, giving a separation of about 3.5 $\mu$sec, as shown in FIG. 1A. $V_S$ is derived from the oscillator stage by peak detection of the collector swing of transistor $T_1$ in FIGS. 2 and 4 by means of diode $D_1$ and capacitor C4. Resistor $R_5$ is necessary to ensure that $V_S$ is stable, because $I_6 > I_7$; but $I_7$30 $I_8$ must be greater than $I_6$.

In general, the load due to an MOST-chip, into which the output stages are designed to work, is purely capacitive. A simulated load as seen by the clock output stages is shown by C10 and R10 in FIG. 3, typical values being 50 pf and 220 kohms respectively.

The operation of the output stages will now be considered with reference to FIG. 3 and FIG. 3A, period by period. In FIG. 3A, the sine wave V1 across one-half of winding 4-5 of transformer $T_x$ is followed, the offset $V_S$ is indicated and also the resultant output wave $V_{out}$; $V_S$ and $V_{out}$ are not in proportion. Assume that $V_1$ (FIG. 3) is positive during period 1 of FIG. 3A. Both diodes $D_3$ and $D_4$ are reverse biased and therefore blocked, and both currents $I_1$ and $I_2$ are zero. $V_S$ discharges to ground through the emitter-base path of $T_4$ acting as a diode, with a current $I_3= V_S/R_4$, and there is no current flow into the load (C10, R10).

At time 2 (in the vicinity of $V_S$), $V_1$ is at ground potential and diodes $D_3$ and $D_4$ are unblocked. Current $I_3$ is now diverted into the collector path of $T_4$ and so into $D_4$, and $T_4$ becomes a current source at the base of $T_3$. During period 3, which follows, the load ($C_D$) becomes charged via $D_3$ to the potential of $V_1$. The potential drops across $D_3$ and $D_4$ are about the same so that the potentials on the base and emitter of $T_3$ are also the same and no current flows through $T_3(V_{B-V_{BE}}=0 I_5 = 0)$.

At time 4, the negative peak of $V_1$ is reached, C10 is charged to the peak voltage of $V_1$ and $D_3$ switches off. $T_3$ commences to operate as an emitter-follower and discharges the load (period 5); a part of the current $I_3$ flows into the base of $T_3$. Diode $D_4$ still conducts and therefore controls $T_3$ during the discharge of the load.

At time $T_6$, again in the vicinity of $V_S$, the voltage $V_1$ has returned to ground potential and the collector current of $T_3$ pinches off. The collector-base diode action of $T_3$ limits the base potential of $T_3$ at ground potential, and this completes the cycle.

Thus, each sine wave has been flattened into a semi-sinusoid, and the two output stages, working alternately (in push-pull) from windings 4-5-6, produce alternately succeeding semi-sinusoids in the load, as shown in FIG. 1A, which combine to give a two-phase clock pulse supply with a specified separation (of about 3.5 $\mu$secs) between the pulses.

Figure 5:
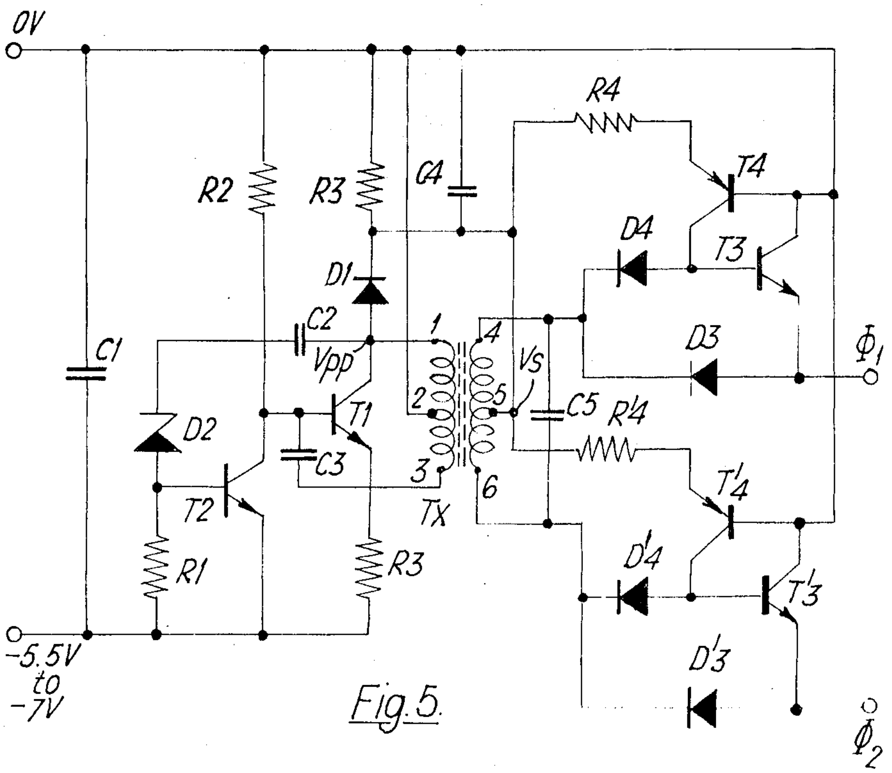
FIG. 5 shows the overall circuit schematic of the complete clock-pulse driver.

FIG. 5 is a complete circuit schematic of the clock driver, and will be seen to consist of FIGS. 2, 3 and 4 suitably arranged and combined to give the two-phase output, shown as $\Phi_1$ and $\Phi_2$.

It may be noted that $T_4$ in FIG. 3 may be replaced by a diode $DT_4$, as shown in FIG. 3B, at the expense of increased power dissipation.

The clock driver design outlined above has been based on integrated circuit fabrication using a high threshold process. In that case, a nominal oscillator swing of 8.8 $V_{pp}$ produced a clock voltage output of 25 volt. However, if a low threshold process is used, the clock voltage 9 is reduced to 18v ± 10 percent, which entails a redesign of the oscillator/output transformer, but the power dissipation on the circuit chip is reduced to a level enabling a further simplified output stage to be employed, in which $D_4$ is replaced by a suitable resistor, in FIG. 3B. This would introduce marginal cost advantages, with an increased power dissipation and power operating characteristics of the circuit.

It is to be understood that the foregoing description of specific examples of this invention is made by way of example only and is not to be considered as a limitation on its scope.

What is claimed is:

1. A clock-pulse generator arranged to produce a series of semi-sinusoidal clock pulses of the same polarity and of specified repetition frequency in a capacitive load, each said pulse being separated from the adjacent pulse by a predetermined interval of time, comprising an amplitude-stabilized self-oscillating sine-wave oscillator including a resonating coil-and-capacitor circuit arranged to drive a pair of output circuits connected to said circuit and to output terminals of said oscillator in push-pull manner, each said output circuit being biased by a unidirectional potential derived from said oscillator and being arranged to suppress one-half of each sine wave thereby to supply a series of spaced, interlocking, unidirectional semi-sinusoids into an external capacitive load coupled to said output circuits.

2. The generator as claimed in claim 1 wherein said oscillator includes an oscillating active element, and wherein said resonating circuit comprises a transformer having a primary winding, a secondary winding and a tertiary winding, said primary winding being coupled to one electrode of said oscillating active element, said tertiary winding being coupled to a second electrode of said element in positive feedback relationship, said secondary winding being tuned capacitively to said specified frequency and having a center tap operatively coupled to said output circuits for enabling said output circuits to be coupled directly to its outer terminals.

3. The generator as claimed in claim 2 wherein said oscillator includes also an amplitude-stabilizing circuit comprising a zener diode and a transistor arranged to compare the voltage swing of said oscillator with the zener voltage of said diode, and to generate correcting pulses for reducing the amplitude of said oscillator when the swing exceeds a predetermined value.

4. The generator as claimed in claim 3 further comprising a peak detector arranged to rectify the voltage swing of said oscillator and means to couple the unidirectional output voltage so obtained to said output circuits as bias therefore via the center tap of said secondary winding.

5. The generator as claimed in claim 1 wherein each of said output circuits comprises a pair of similarly-directed diodes connected together at one electrode thereof and to the respective output of said oscillator to suppress one half-cycle of the output wave, and connected together at the other electrode thereof via the base-emitter path of a first transistor operating as an emitter-follower for discharging a load connected to said first transistor; and a complementary transistor connected base-collector across the collector-base path of said first transistor to act as a current source for charging such a load from said oscillator output; and a regulating resistor in circuit with said second transistor.

6. A clock-pulse generator arranged to produce a series of semi-sinusoidal clock pulses of the same polarity having a predetermined basic repetition frequency with the pulses thereof spaced from one another by a predetermined time duration, for use with substantially capacitive loads, comprising a Hartley type oscillator circuit amplitude-stabilized by means of a stabilization circuit consisting of a comparison circuit including a zener diode and a transistor as coupling element, said oscillator comprising a resonant circuit consisting of a ferrite-cored transformer having a primary winding tapped near one end to provide a feedback winding, and a secondary winding capacitively tuned to the required frequency; said secondary winding being also center-tapped to provide a pair of output windings arranged to operate in push-pull manner to two output circuits; a rectifier circuit arranged to rectify a portion of the voltage of said oscillator so as to provide a unidirectional bias for said output circuits; and wherein said output circuits each comprise an arrangement of two diodes and a pair of complementary transistors so connected as to charge a capacitive load connected to said output circuits on one half-cycle of said oscillator output and to suppress the alternate half-cycle, whereby the two output circuits cooperate to produce interlocking semi-sinusoidal outputs having the desired clock-pulse waveform.

* * * * *